United States Patent
Francis

(10) Patent No.: US 12,176,900 B2
(45) Date of Patent: Dec. 24, 2024

(54) BUFFER CIRCUITRY HAVING IMPROVED BANDWIDTH AND RETURN LOSS

(71) Applicant: XILINX, INC., San Jose, CA (US)

(72) Inventor: Roswald Francis, Kildare (IE)

(73) Assignee: XILINX, INC., San Jose, CA (US)

( * ) Notice: Subject to any disclaimer, the term of this patent is extended or adjusted under 35 U.S.C. 154(b) by 186 days.

(21) Appl. No.: 17/884,342

(22) Filed: Aug. 9, 2022

(65) Prior Publication Data

US 2024/0056081 A1 Feb. 15, 2024

(51) Int. Cl.
  *H04L 25/03* (2006.01)
  *H03K 19/0175* (2006.01)
  *H03K 19/0185* (2006.01)
  *H03K 19/0944* (2006.01)
  *H03M 1/12* (2006.01)

(52) U.S. Cl.
  CPC . *H03K 19/0944* (2013.01); *H03K 19/017545* (2013.01); *H03K 19/0185* (2013.01); *H03M 1/12* (2013.01)

(58) Field of Classification Search
  CPC ....... H03K 19/017545; H03K 19/0185; H03K 19/0944; H03M 1/12
  See application file for complete search history.

(56) References Cited

U.S. PATENT DOCUMENTS

| | | | |
|---|---|---|---|
| 10,862,521 B1* | 12/2020 | Raviprakash | H03H 7/25 |
| 10,944,397 B1* | 3/2021 | Yuan | H03K 17/6872 |
| 2009/0039916 A1* | 2/2009 | Buchmann | G11C 7/1051 |
| | | | 326/38 |
| 2013/0207725 A1* | 8/2013 | Afshari | H03G 3/00 |
| | | | 330/144 |
| 2015/0349722 A1* | 12/2015 | Wang | H04B 1/40 |
| | | | 330/295 |
| 2019/0253284 A1* | 8/2019 | Jalali Far | H04L 25/03146 |
| 2022/0103149 A1* | 3/2022 | Duan | H04B 1/18 |
| 2023/0027964 A1* | 1/2023 | Park | H01L 23/5227 |
| 2023/0308132 A1* | 9/2023 | Gonzales | H04B 3/145 |

* cited by examiner

*Primary Examiner* — Kurtis R Bahr
(74) *Attorney, Agent, or Firm* — Patterson + Sheridan, LLP

(57) ABSTRACT

An electronic system includes a buffer and analog-to-digital circuitry. The buffer includes buffer circuitry that includes an input node that receives an input signal. The buffer circuitry further includes coil circuitry that is electrically connected to the input node and a first node. The coil circuitry includes a first inductor and a second inductor. Further, the buffer circuitry includes a resistor that is electrically connected to the first node and a second node. A capacitor of the buffer circuitry is electrically connected to the second node and a third node. The third node is disposed between the first inductor and the second inductor. The buffer circuitry is configured to output an output signal based on the input signal.

20 Claims, 4 Drawing Sheets

US 12,176,900 B2

BUFFER CIRCUITRY HAVING IMPROVED BANDWIDTH AND RETURN LOSS

TECHNICAL FIELD

Examples of the present disclosure generally relate to an inverter buffer, and, in more particular to, an inverter buffer having improved bandwidth and return loss.

BACKGROUND

In various electronic systems, inverter buffer circuitries are connected to the input of analog-to-digital converter (ADC) circuitry. The inverter buffer circuitries isolate the ADC circuitry from the circuit elements external to the ADC circuitry. For example, the inverter buffer circuitries isolate ADC dynamics, including kick back, and charge injection, among others, from the external circuit elements. In a typical configuration, such an inverter buffer circuitry includes a termination resistor matched to the input port impedance, and a feedback resistor that is matched to the termination resistor, for unity gain. However, in such an inverter buffer, a low pass filter is formed that degrades the performance of the inverter buffer. In some instances, a capacitance network is formed across the virtual ground node within the inverter buffer. However, in such instances, the output of the inverter buffer drives an increased capacitance, degrading the noise performance and non-linearity of the inverter buffer.

Thus, there is a need for an improved inverter buffer.

SUMMARY

In one example, buffer circuitry includes an input node, coil circuitry, a resister, and a capacitor. The input node receives an input signal. The coil circuitry is electrically connected to the input node and a first node. The coil circuitry includes a first inductor and a second inductor. Further, the buffer circuitry includes a resistor electrically connected to the first node and a second node. A capacitor of the buffer circuitry is electrically connected to the second node and a third node. The third node is disposed between the first inductor and the second inductor. The buffer circuitry is configured to output an output signal based on the input signal.

In one example, an electronic system includes buffer circuitry, and analog-to-digital converter (ADC) circuitry. The buffer circuitry receives an input signal and output an output signal based on the input signal. The buffer circuitry includes an input node, coil circuitry, a resistor, and a capacitor. The input node receives the input signal. The coil circuitry is electrically connected to the input node. The resistor is electrically connected to the coil circuitry and a first node. The capacitor is electrically connected in parallel with the resistor and a first inductor of the coil circuitry. The ADC circuitry is coupled to the output of the buffer circuitry, and receives the output signal.

In one example, differential buffer circuitry includes a first input node, a second input node, a first coil circuitry, a first resistor, a first capacitor, second coil circuitry, a second resistor, and a second capacitor. The first input node receives a first input signal of a differential input signal. The second input node receives a second input signal of the differential input signal. The first coil circuitry is electrically connected to the first input node. The first coil circuitry includes a first inductor and a second inductor. The first resistor is electrically connected to the first coil circuitry and a first node. The first capacitor is electrically connected to the first node and to a second node. The second node is disposed between the first inductor and the second inductor. The second coil circuitry is electrically connected to the second input node. The second coil circuitry includes a third inductor and a fourth inductor. The second resistor is electrically connected to the second coil circuitry and a third node. The second capacitor is electrically connected to the third node and to a fourth node. The fourth node is disposed between the third inductor and the fourth inductor.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
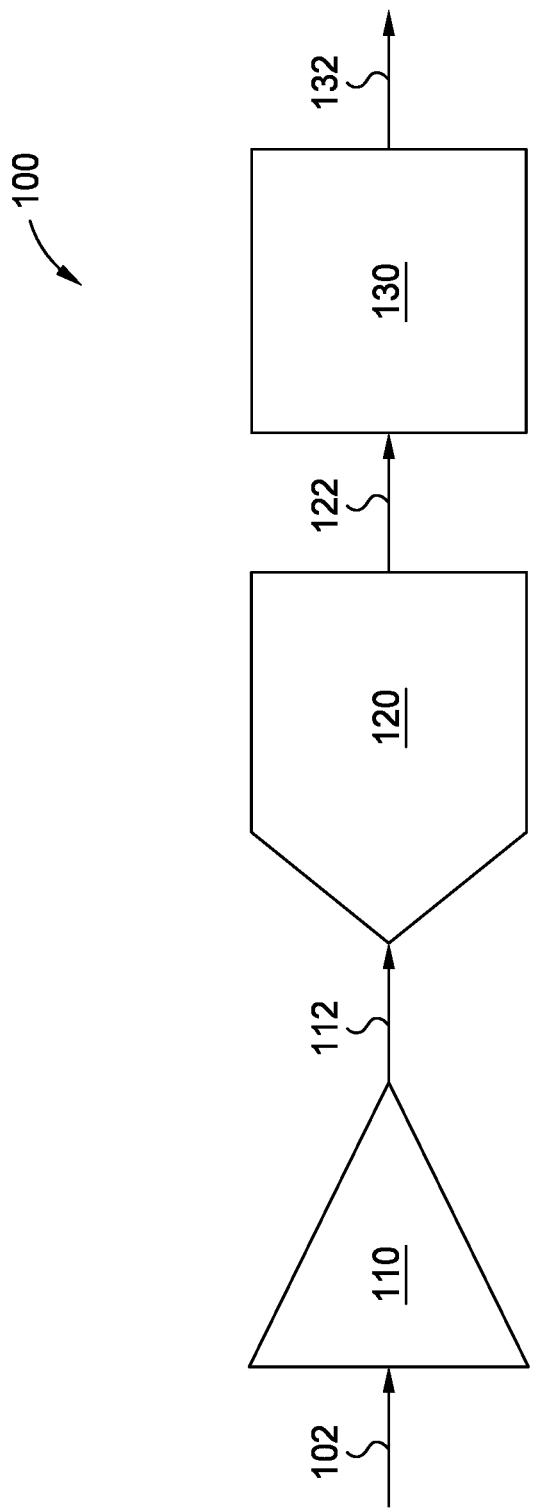
FIG. 1 is a block diagram of an electronic system, according to some examples.

An electronic system having inverter buffer circuitry and an analog-to-digital (ADC) circuitry are disclosed herein. The inverter buffer circuitry is connected to the input of the ADC circuitry to isolate the ADC circuitry from external circuit elements (e.g., circuit elements external to the ADC circuitry). Isolating the ADC circuitry from the external circuit elements isolates the dynamics (e.g., kick back and charge injection, among others) of the ADC circuitry from the external circuit elements, thus, improving the performance of the electronic system.

In various instances, an inverter buffer circuitry includes transistor based inverter circuitry and a feedback resistor. The gate-drain capacitances of the transistors and the feedback resistor function as a low-pass filter within the inverter buffer circuitry, limiting the 3 dB bandwidth of the inverter buffer circuitry. In some instances, capacitor networks have been added to an inverter buffer circuitry to mitigate the gate-drain capacitances. The capacitor networks are added such that the corresponding capacitors have a similar capacitance value to the gate-drain capacitance (Cgd) of the inverter transistors, and are added in a cross coupled manner between a virtual ground of an inverter buffer and the output of another inverter buffer in a differential implementation. However, the capacitor networks degrade the noise performance and non-linearity of the inverter buffer circuitries.

The inverter buffer circuitry described herein has increased 3 dB bandwidth, return loss, noise performance, and non-linearity as compared to other inverter buffer circuitries. As is described in greater detail in the following, an inverter buffer circuitry includes coil circuitry connected to an input node of the inverter buffer circuitry and a termination resistor connected between the coil circuitry and inverter circuitry. Further, a capacitor is connected in parallel with the termination resistor and an inductor of the coil circuitry. The capacitor mitigates the low-pass filter effects of the inverter buffer circuitry (by effectively cancelling the Cgd of the inverter buffer transistors) and the coil circuitry decreases the capacitance loading at the input node. Accordingly, the inverter buffer circuitry as described herein has improved 3 dB bandwidth, return loss, noise performance, and non-linearity as compared to conventional inverter buffer circuitries.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 illustrates an electronic system 100, according to one or more examples. The electronic system 100 is part of a communication system or a signal processing system, among others. In one specific example, the electronic system 100 is a receiver system for a wireless receiver system. The wireless receiver system may be a radio frequency (RF) receiver system.

The electronic system 100 includes buffer circuitry 110, analog to digital (ADC) circuitry 120, and processing circuitry 130. The electronic system 100 may further include one or more integrated circuit (IC) chips. For example, the buffer circuitry 110, the ADC circuitry 120, and the processing circuitry 130 are disposed within the one or more IC chips. In one example, at least two of the buffer circuitry 110, the ADC circuitry 120, and the processing circuitry 130 are disposed within a first IC chip. In another example, at least one of the buffer circuitry 110, the ADC circuitry 120, and the processing circuitry 130 is disposed within an IC chip separately from at least one other the buffer circuitry 110, the ADC circuitry 120, and the processing circuitry 130. In one example, the electronic system 100 includes an IC chip that is an application specific IC device. In another example, the electronic system 100 includes an IC chip that a programmable device. For example, the IC chip is a field-programmable gate array (FPGA) device. In one or more examples, the IC chip is a system on chip (SoC) device. Further, the IC chip may include multiple interconnected IC chips. In such an example, the IC chips may be vertically stacked forming a three dimensional stack of IC chips.

The buffer circuitry 110 has one or more inputs that receives the input signal 102. The input signal 102 may be differential signal. In one example, the input signal 102 is a wireless signal, however, in other examples, the input signal 102 is other types of signals. Further, the input signal 102 is an analog signal. In one example, the input signal 102 is an RF signal or based on RF signal (e.g., a signal generated from an RF signal).

The buffer circuitry 110 generates the signal 112 from the input signal 102. The signal 112 may be a differential signal. In one example, the buffer circuitry 110 has unity gain (e.g., a gain of one), and the magnitude of the signal 112 and the magnitude of the input signal 102 are substantially the same. In other examples, the buffer circuitry 110 has a gain of greater than one, and the magnitude of the signal 112 is greater than that of the input signal 102. The buffer circuitry 110 may be an inverting buffer. The signal 112 is output via one or more outputs of the buffer circuitry 110.

The ADC circuitry 120 includes one or more inputs that are connected to the one or more outputs of the buffer circuitry 110. The ADC circuitry 120 receives the signal 112 from the buffer circuitry 110 and generates the signal 122. In one example, the signal 112 is an analog signal, and the ADC circuitry 120 converts the signal 112 from the analog domain to the digital domain, generating the signal 122, which is a digital signal. The ADC circuitry 120 outputs the signal 122 via one or more outputs of the ADC circuitry.

In one or more examples, the buffer circuitry 110 functions as a buffer between the ADC circuitry 120 and elements external to the ADC circuitry 120, mitigating the effects of external interference on the functions of the ADC circuitry 120. Further, the buffer circuitry 110 may mitigate the negative effects of the ADC circuitry 120 (e.g., switching noise injection) on circuitry external to the ADC circuitry 120.

The processing circuitry 130 includes one or more inputs that receives the signal 122 from the ADC circuitry 120. The processing circuitry 130 performs one or more of sampling, equalization, and filtering, among others. The processing circuitry 130 outputs the signal 132, generated from the signal 122, to one or more other electronic devices and/or systems for further processing.

Figure 2:
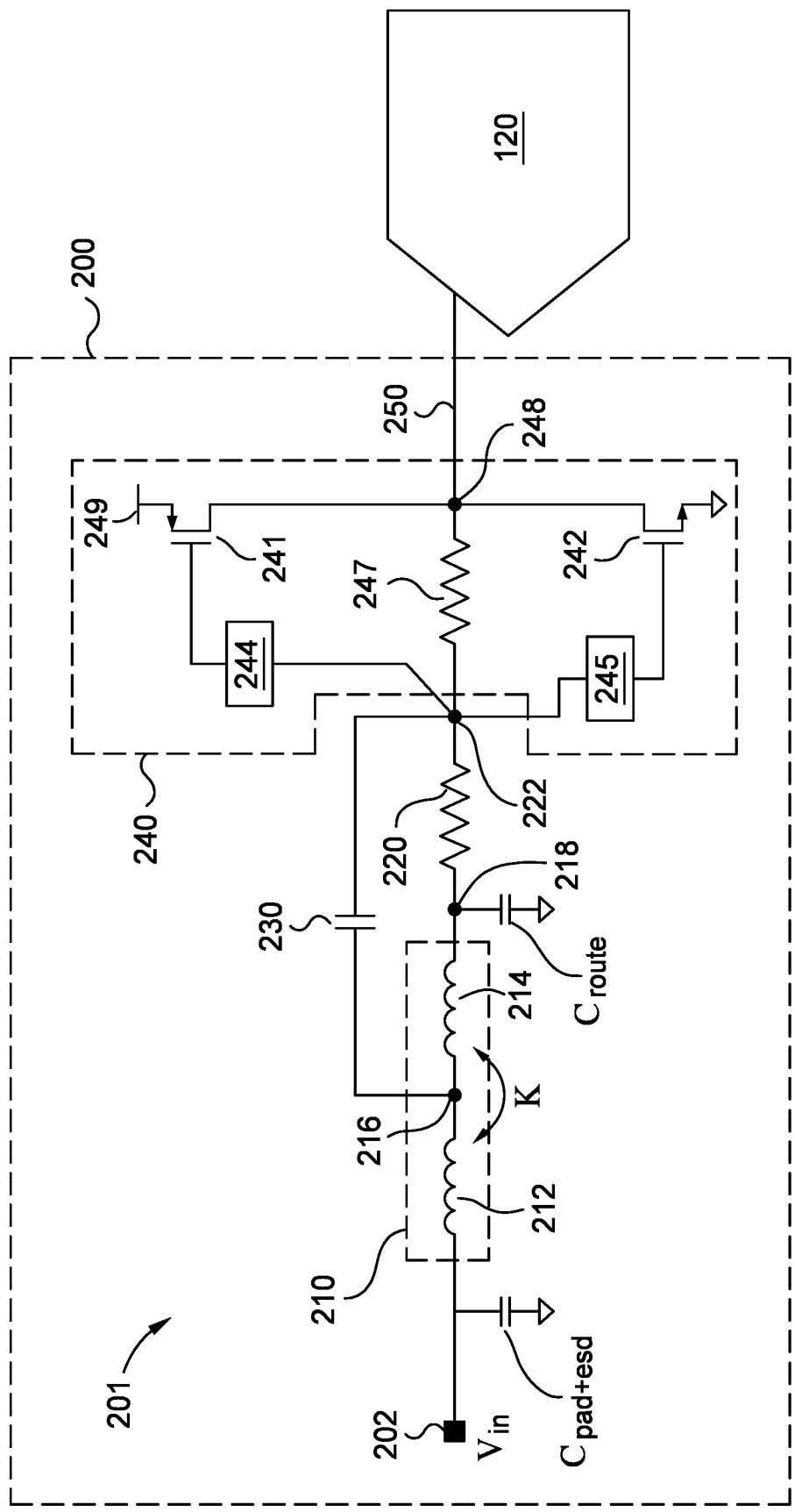
FIG. 2 illustrates a schematic circuit diagram of a buffer, according to some examples.

FIG. 2 illustrates the buffer 200 including the buffer circuitry 201 and the ADC circuitry 120. The buffer 200 is an inverting buffer 200. The buffer circuitry 201 includes input node 202 that receives the input signal Vin (e.g., the input signal 102 of FIG. 1). The buffer circuitry 201 further includes coil circuitry 210, resistor 220, capacitor 230, and inverter circuitry 240. The capacitance $C_{pad+esd}$ is the pad capacitance and electrostatic discharge (ESD) protection device(s) capacitance at the input node 202.

The coil circuitry 210 is electrically connected between the input node 202 and the node 218. The coil circuitry 210 includes the inductor 212 and the inductor 214. The inductor 212 is electrically connected between the input node 202 and the node 216. Further, the inductor 214 is electrically connected between the node 216 and the node 218. The inductors 212 and 214 are connected in series with each other between the nodes 202 and 218. The inductance of the inductor 212 and the inductance of the inductor 214 may be equal to each other. In one or more examples, the inductance of the inductor 212 is greater than or less than the inductance of the inductor 214. The inductance of the inductor 212 is about 400 pH, and the inductance of the inductor 214 is about 900 pH. In other examples, the inductance of the inductor 212 may be greater than or less than about 400 pH. Further, the inductance of the inductor 214 may be greater than or less than about 900 pH. In one example, the signal at the node 216 is referred to as $V_{inT}$.

In one example, the inductors 212 and 214 have a coupling coefficient of K. In one example, the coupling coefficient K is 0, and the inductors 212 and 214 may be considered to be connected in series and shunt (parallel) with respect to the input signal Vin. Further, in an example where the coupling coefficient K is greater than 0 (positive) or less than 0 (negative), the coil circuitry 210 is configured as T-coil circuitry. In one example, the coupling coefficient K is 0.4. In one or more examples, the inductor 212 and the inductor 214 increase the bandwidth of the node 216. For example, configuring the coil circuitry 210 as a t-coil circuitry increases the bandwidth of the buffer circuitry 201.

The resistor 220 is electrically connected between the node 218 and the node 222. The resistor 220 may be referred to as a termination resistor. The resistance value of the resistor 220 corresponds to the port impedance of the driver circuitry driving the input node 202. The resistor 220 improves the return loss of the buffer circuitry 201, mitigating reflection by the buffer circuitry 201, and improving the performance of the buffer circuitry 201. In one example, the resistance of the resistor 220 is about 50 ohms. In other examples, the resistance of the resistor 220 is greater than or less than 50 ohms. In one or more examples, the voltage at the node 222 is a virtual ground voltage Vgnd. In one example, the routing between the coil circuitry 210 and the resistor 220 is represented as $C_{route}$.

The capacitor 230 is electrically connected between the nodes 216 and 222. The capacitor 230 may be referred to as a feedforward capacitor. The capacitor 230 is electrically connected in parallel with the inductor 214, and the resistor 220. In one example, the capacitance of the capacitor 230 is about 984 fF. In other examples, the capacitance of the capacitor 230 is greater than or less than 984 fF.

The inverter circuitry 240 is connected between the nodes 222 and 248. The inverter circuitry 240 includes transistors 241 and 242, level shifter circuitries 244 and 245, and resistor 247. The level shifter circuitry 244 is connected between the node 222 and the gate of the transistor 241. The level shifter circuitry 244 increases or decreases the voltage level of the signal at node 222. The transistor 241 is a p-channel metal-oxide semiconductor (PMOS) transistor. The source of the transistor 241 is connected the power supply node 249. The power supply node 249 receives a power supply signal having a voltage value of 1.2 V, 1.5 V, 1.8 V, 2.5 V, or 3.3 V, among others. The drain of the transistor 241 is connected to the node 248.

The level shifter circuitry 245 receives and adjusts the voltage level of the signal at the node 222. The output signal of the level shifter circuitry 245 has the same polarity as the output signal of the level shifter circuitry 244. The level shifter circuitries 244 and 245 are direct current (DC) shifting blocks. In one or more examples, the level shifter circuitries 244 and 245 do not alter the signal voltages in magnitude or polarity. The level shifter circuitries 244 and 245 provide the appropriate DC bias voltages to the gates of the transistors 241 and 242, respectively. In one or more examples, the output signal of the level shifter circuitry 244 and the output signal of the level shifter circuitry 245 have the same magnitude.

The level shifter circuitry 245 is electrically connected to and drives the gate of the transistor 242. The transistor 242 is an n-channel metal-oxide semiconductor (NMOS) transistor. The source of transistor 242 is connected to a node that receives a ground signal or other reference voltage. The drain of the transistor 242 is connected to the node 248. Accordingly, the drain of the transistor 241 is connected to the drain of the transistor 242 at the node 248.

The resistor 247 is connected between the node 222 and the node 248. The resistor 247 functions as a feedback resistor $R_{fb}$. In one example, the resistance of the resistor 247 is the same as the resistance of the resistor 220, which is equal to the resistance at the input node 202 (e.g., $R_0$), and the gain of the buffer circuitry 201 is unity, or one. In one example, $R_0$ is the port impedance of the driver circuitry connected to the input node 202. In one example, the resistance of the resistor 220, the resistance of the resistor 247, and the resistance at the input node 202 are about 50 ohms. In other examples, resistances of greater than or less than 50 ohms may be used. In another example, the gain of the buffer circuitry 201 may be increased by varying the resistance values of the resistor 220 and the resistor 247.

In one or more examples, the frequency response of the buffer circuitry 201 is low pass in nature, creating a low pass filter. For example, a low pass filter may be formed by the parallel combination of the resistor 247 and the gate-drain capacitances of the transistors 241 and 242 (e.g., $C_{gdp}$ and $C_{gdn}$) and layout capacitance (e.g., $C_{route}$). The combined gate-drain capacitance and layout capacitance may be referred to as capacitance $C_X$, where $C_X$ is $C_{gdp}+C_{gdn}$. The low pass filter limits the 3 dB bandwidth of the buffer circuitry 201, negatively affecting the performance of the buffer circuitry 201.

In one or more examples, the capacitance of the capacitor 230 is selected to be about the value of capacitance $C_X$. Accordingly, the capacitance of the capacitor 230 mitigates the low pass filter within the buffer circuitry 201, improving the 3 dB bandwidth and frequency response of the buffer circuitry 201. However, the capacitor 230 may increase the loading at the input node 202, negatively affecting (e.g., degrading) the return loss of the buffer circuitry 201. Return loss refers to the amount of power that is reflected back to an external driver from the front end of the buffer 200. In one example, the more signal power that is returned to the external driver, the worse the return loss. The return loss may be measured as a negative quantity. Accordingly, the more negative the measurement of return loss, the better the return loss. For example, buffer circuitry with a return loss of about −10 dB has a better return loss than buffer circuitry with a return loss of about −5 dB. In one or more examples, the coil circuitry 210 isolates the capacitor 230 from the loading at the input node 202, increasing the 3 dB bandwidth and the return loss of the buffer circuitry 201. In one example, the coil circuitry 210 is configured as t-coil circuitry to isolate the capacitor 230 from the loading at the input node 202. In one or more examples, the inductance of the inductor 212, the inductance of the inductor 214, the coupling coefficient K, and/or the capacitance 230 can be adjusted to increase or decrease the 3 dB bandwidth and return loss of the buffer circuitry 201. A buffer circuitry 201 including the coil circuitry 210 and the capacitor 230 has a wider bandwidth and improved return loss as compared to buffer circuitries that do not include the coil circuitry 210 and the capacitor 230.

The output signal 250 of the inverter circuitry 240 and the buffer circuitry 201 is communicated to the ADC circuitry 120.

Figure 3:
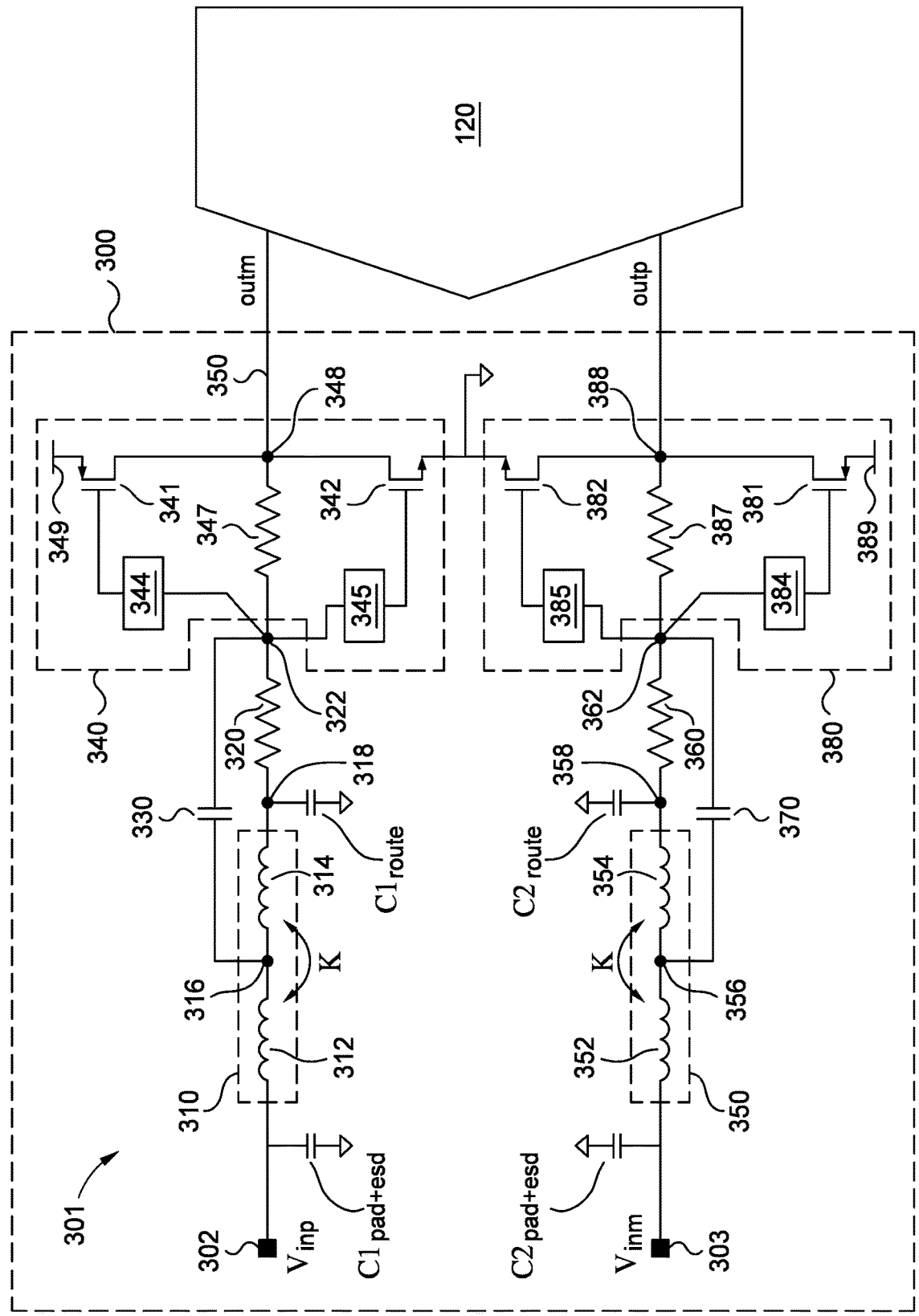
FIG. 3 illustrates a schematic circuit diagram of a differential buffer, according to some examples.

FIG. 3 illustrates a buffer 300 and the ADC circuitry 120. The buffer 300 includes buffer circuitry 301. The buffer 300 is a differential buffer. The buffer 300 is an inverting buffer. The buffer circuitry 301 is differential buffer circuitry. Each differential path of the buffer circuitry 301 is configured similar to the buffer circuitry 201 of FIG. 2.

The buffer circuitry 301 includes input node 302 that receives the input signal $V_{inp}$. The input signal $V_{inp}$ is a first signal of a differential input signal (e.g., the signal 102 of FIG. 1). The differential input signal is made up of the input signal $V_{inp}$ and $V_{inm}$. The buffer circuitry 301 further includes coil circuitry 310, resistor 320, capacitor 330, and inverter circuitry 340. The capacitance $C1_{pad+esd}$ is the pad capacitance and ESD protection device(s) capacitance at the input node 302.

The coil circuitry 310 is electrically connected between the input node 302 and the node 318. The coil circuitry 310 includes the inductor 312 and the inductor 314. The inductor 312 is electrically connected between the input node 302 and the node 316. Further, the inductor 314 is electrically connected between the node 316 and the node 318. The inductors 312 and 314 are connected in series with each other between the nodes 302 and 318. The inductance of the inductor 312 and the inductance of the inductor 314 may be equal to each other. In one or more example, the inductance of the inductor 312 is greater than or less than the inductance of the inductor 314.

The coil circuitry 310 is configured similar to that of the coil circuitry 210 of FIG. 2. In one example, the inductors 312 and 314 have a coupling coefficient of K. The coupling coefficient K may be zero, greater than zero, or less than zero.

The resistor 320 is electrically connected between the node 318 and the node 322. The resistor 320 may be referred to as a termination resistor. The resistance value of the resistor 320 corresponds to the port impedance of the driver circuitry driving the input node 302. The resistor 320 is configured similar to the resistor 220 of FIG. 2. In one example, the routing between the coil circuitry 310 and the resistor 320 is represented as $C_{route}$.

The capacitor 330 is electrically connected between the nodes 316 and 322. The capacitor 330 may be referred to as a feedforward capacitor. The capacitor 330 is electrically connected in parallel with the inductor 314, and the resistor 320. Further, the capacitor 330 is configured similar to the capacitor 230 of FIG. 2.

The inverter circuitry 340 is electrically connected to the node 322 and to the node 348. The inverter circuitry 340 includes transistors 341 and 342, level shifter circuitries 344 and 345, and resistor 347. The inverter circuitry 340 is configured similar to that of the inverter circuitry 240 of FIG. 2. The level shifter circuitry 344 is connected between the node 322 and the gate of the transistor 341. The level shifter circuitry 344 increases or decreases the voltage level of the signal at node 322. The transistor 341 is PMOS transistor. The source of the transistor 341 is connected the power supply node 349. The drain of the transistor 341 is connected to the node 348.

The level shifter circuitry 345 is electrically connected to and drives the gate of the transistor 342. The transistor 342 is an NMOS transistor. The source of transistor 342 is connected to a node that receives a ground or other reference voltage. The drain of the transistor 342 is connected to the node 348. Accordingly, the drain of the transistor 341 is connected to the drain of the transistor 342 at the node 348.

The resistor 347 is connected between the node 322 and the node 348. The resistor 347 functions as a feedback resistor $R_{fb}$ and is configured similar to that of the resistor 247 of FIG. 2.

The output signal outm of the inverter circuitry 340 and the buffer circuitry 301 is communicated to the ADC circuitry 120.

The buffer circuitry 301 further includes input node 303 that receives the input signal $V_{inm}$. The buffer circuitry 301 further includes coil circuitry 350, resistor 360, capacitor 370, and inverter circuitry 380. The capacitance $C2_{pad+esd}$ is the pad capacitance and ESD protection device(s) capacitance at the input node 303.

The coil circuitry 350 is electrically connected between the input node 303 and the node 358. The coil circuitry 350 includes the inductor 352 and the inductor 354. The inductor 352 is electrically connected between the input node 303 and the node 356. Further, the inductor 354 is electrically connected between the node 356 and the node 358. The inductors 352 and 354 are connected in series with each other between the nodes 303 and 358. The inductance of the inductor 352 and the inductance of the inductor 354 may be equal to each other. In one or more example, the inductance of the inductor 352 is greater than or less than the inductance of the inductor 354.

The coil circuitry 350 is configured similar to that of the coil circuitry 210 of FIG. 2. In one example, the inductors 352 and 354 have a coupling coefficient of K. The coupling coefficient K may be zero, greater than zero, or less than zero.

The resistor 360 is electrically connected between the node 358 and the node 362. The resistor 360 may be referred to as a termination resistor. The resistance value of the resistor 360 corresponds to the port impedance of the driver circuitry driving the input node 303. The resistor 360 is configured similar to the resistor 220 of FIG. 2. In one example, the routing between the coil circuitry 350 and the resistor 360 is represented as $C2_{route}$.

The capacitor 370 is electrically connected between the nodes 356 and 362. The capacitor 370 may be referred to as a feedforward capacitor. The capacitor 370 is electrically connected in parallel with the inductor 354, and the resistor 360. Further, the capacitor 370 is configured similar to the capacitor 230 of FIG. 2. In one example, the capacitance of the capacitor 370 is the same as the capacitance of the capacitor 330.

The inverter circuitry 380 is electrically connected to the node 362 and the node 388. The inverter circuitry 380 includes transistors 381 and 382, level shifter circuitries 384 and 385, and resistor 387. The inverter circuitry 380 is configured similar to that of the inverter circuitry 240 of FIG. 2. The level shifter circuitry 384 is connected between the node 362 and the gate of the transistor 381. The level shifter circuitry 384 increases or decreases the voltage level of the signal at node 362. The transistor 381 is PMOS transistor. The source of the transistor 381 is connected the power supply node 389. The drain of the transistor 381 is connected to the node 388.

The level shifter circuitry 385 is electrically connected to and drives the gate of the transistor 382. The transistor 382 is an NMOS transistor. The source of transistor 382 is connected to a node that receives a ground or other reference voltage. The drain of the transistor 382 is connected to the node 388. Accordingly, the drain of the transistor 381 is connected to the drain of the transistor 382 at the node 388.

The resistor 387 is connected between the node 362 and the node 388. The resistor 387 functions as a feedback resistor $R_{fb}$ and is configured similar to that of the resistor 247 of FIG. 2.

The output signal outp of the inverter circuitry 380 and the buffer circuitry 301 is communicated to the ADC circuitry 120. The output signals outm and outp are signals of a differential output signal.

In one example, the coil circuitry 310, the capacitor 330, the coil circuitry 350, and the capacitor 370 increase the 3 dB bandwidth and improve the return loss of the buffer circuitry 301 similar as is described above with regard to the coil circuitry 210 and capacitor 230 of the buffer circuitry 201 of FIG. 2.

Figure 4:
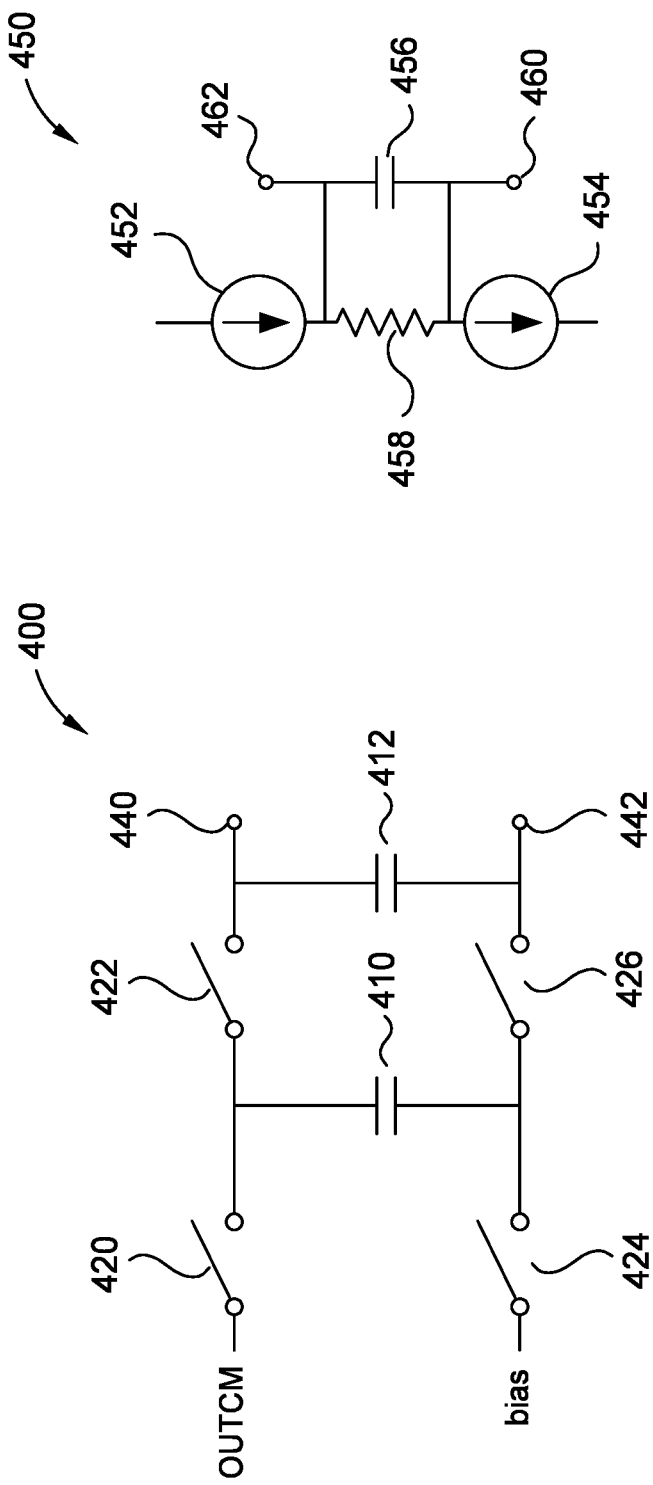
FIG. 4 illustrates a schematic circuit diagrams of level shifter circuitry, according to some examples.

FIG. 4 illustrates example circuit diagrams of level shifter 400 and level shifter 450. In one or more examples, the level shifter 400 or the level shifter 450 may be used as the level shifter circuitries 244 and 245 of FIG. 2, and 344, 345, 384, and 385 of FIG. 3. In other examples, the level shifter circuitries 244 and 245 of FIG. 2, and 344, 345, 384, and 385 of FIG. 3 may have different architectures from that illustrated in FIG. 4.

The level shifter 400 is a switched capacitor level shifter and includes capacitors 410 and 412, and switches 420, 422, 424, and 426. The switch 420 is electrically connected between a node that receives the voltage signal OUTCM and the capacitor 410, and the switch 424 is electrically connected between a node that receives the voltage signal bias and the capacitor 410. With reference to FIG. 2, the node that receives the voltage signal OUTCM is connected to the node 222 and the node that receives the voltage signal bias is connected to the gate of the transistor 241 and/or 242. The voltage signal OUTCM determines the output common mode of the node 222 in FIG. 2. Stated another way, the inverter output common mode voltage is set by the voltage signal OUTCM. The node that outputs the voltage signal OUTCM is the same as the ground voltage node in FIG. 2 that receives $V_{cm}$ or another reference voltage signal. Further, the switch 422 is electrically connected between the capacitor 410 and the capacitor 412, and the switch 426 is electrically connected between the capacitor 410 and the capacitor 412. Further, the capacitor 412 is connected between the input node 440 and the output node 442. The input node 440 receives an input signal, and the output node 442 outputs the output signal. In one or more examples, the input node 440 is the same as the nodes 222 of FIG. 2, and the nodes 322 and 362 of FIG. 3. Further, in one or more examples, the node 442 is the gate of the transistors 241 and 242 of FIG. 2, and the transistors 341, 342, 381, and 382 of FIG. 3.

The level shifter 450 is a current multiplier level shifter and includes current sources 452 and 454, capacitor 456, and resistor 458. The resistor 458 is connected in parallel with the capacitor 456. The capacitor 456 is connected between the input node 460 and the output node 462. The current source 452 is electrically connected to the capacitor 456 and the resistor 458 and outputs a current to the capacitor 456 and the resistor 458. The current source 454 is electrically connected to the capacitor 456 and the resistor 458 and sinks a current received from the capacitor 456 and the resistor 458. The level shifter 450 receives an input signal via the input node 460 and outputs an adjusted signal via the output node 462. With reference to FIG. 2, the node 460 is connected to the node 222 and the node 462 is connected to the gate of the transistor 241 and/or 242.

As is described above, an inverter buffer circuitry including a coil circuitry, a termination resistor and feedforward capacitor as described above has improved 3 dB bandwidth, return loss, noise performance, and non-linearity as compared to other inverter buffer circuitries. The coil circuitry mitigates the loading at the input node of the inverter buffer due to the feedforward capacitor, and the feedforward capacitor mitigates the low-pass filter effects of the inverter buffer circuitry.

While the foregoing is directed to specific examples, other and further examples may be devised without departing from the basic scope thereof, and the scope thereof is determined by the claims that follow.

What is claimed is:

1. A buffer circuitry comprising:
   an input node configured to receive an input signal;
   coil circuitry electrically connected to the input node and a first node, the coil circuitry comprising a first inductor and a second inductor;
   a resistor electrically connected to the first node and a second node;
   a capacitor electrically connected to the second node and a third node, the third node disposed between the first inductor and the second inductor; and
   inverter circuitry comprising an input connected to the resistor via the second node and an output connected to a fourth node, wherein the inverter circuitry is configured to output an output signal via the fourth node based on a signal received at the second node.

2. The buffer circuitry of claim 1, wherein
   the inverter circuitry is further configured to output the output signal from the buffer circuitry.

3. The buffer circuitry of claim 2, wherein the inverter circuitry comprises:
   a first transistor and a second transistor, wherein a capacitance of the capacitor corresponds to a gate-drain capacitance of the first transistor and a gate-drain capacitance of the second transistor.

4. The buffer circuitry of claim 1, wherein:
   the first inductor is connected between the input node and the third node; and
   the second inductor is connected between the third node and the first node.

5. The buffer circuitry of claim 4, wherein the capacitor is electrically connected in parallel with the resistor and the second inductor.

6. The buffer circuitry of claim 1, wherein the first inductor and the second inductor are configured as t-coil circuitry.

7. An electronic system comprising:
   buffer circuitry configured to receive an input signal and output an output signal based on the input signal, the buffer circuitry comprising:
     an input node configured to receive the input signal;
     coil circuitry electrically connected to the input node;
     a resistor electrically connected to the coil circuitry and a first node;
     a capacitor electrically connected in parallel with the resistor and a first inductor of the coil circuitry; and
     inverter circuitry electrically connected to the resistor; and
   analog-to-digital converter (ADC) circuitry coupled to the output of the buffer circuitry and configured to receive the output signal.

8. The electronic system of claim 7, wherein
   the inverter circuitry a first transistor and a second transistor.

9. The electronic system of claim 8, wherein a capacitance of the capacitor corresponds to a gate-drain capacitance of the first transistor and a gate-drain capacitance of the second transistor.

10. The electronic system of claim 7, wherein the first inductor is connected to a second node and a third node, and the coil circuitry further comprises a second inductor connected to the input node and the second node.

11. The electronic system of claim 10, wherein the capacitor is electrically connected to the first node and the second node, and the first inductor and the second inductor are configured as t-coil circuitry.

12. The electronic system of claim 7, wherein the ADC circuitry converts the output signal from an analog domain to a digital domain.

13. A differential buffer circuitry comprising:
    a first input node configured to receive a first input signal of a differential input signal;
    a second input node configured to receive a second input signal of the differential input signal;

first coil circuitry electrically connected to the first input node, the first coil circuitry comprising a first inductor and a second inductor;

a first resistor electrically connected to the first coil circuitry and a first node;

a first capacitor electrically connected to the first node and to a second node, the second node disposed between the first inductor and the second inductor;

first inverter circuitry electrically connected to the first resistor via the first node and a first output node;

second coil circuitry electrically connected to the second input node, the second coil circuitry comprising a third inductor and a fourth inductor;

a second resistor electrically connected to the second coil circuitry and a third node; and a second capacitor electrically connected to the third node and to a fourth node, the fourth node disposed between the third inductor and the fourth inductor.

14. The differential buffer circuitry of claim 13, wherein the first inverter circuitry comprising a first transistor and a second transistor, and wherein a capacitance of the first capacitor corresponds to a gate-drain capacitance of the first transistor and a gate-drain capacitance of the second transistor.

15. The differential buffer circuitry of claim 14, wherein the differential buffer circuitry further comprises:

second inverter circuitry electrically connected to the third node and a second output node, the second inverter circuitry comprising a third transistor and a fourth transistor, and wherein a capacitance of the second capacitor corresponds to a gate-drain capacitance of the third transistor and a gate-drain capacitance of the fourth transistor.

16. The differential buffer circuitry of claim 13, wherein the first inductor is electrically connected between the first input node and the second node, and the second inductor is electrically connected between the second node and the first resistor.

17. The differential buffer circuitry of claim 16, wherein the first capacitor is connected in parallel with the first resistor and the second inductor.

18. The differential buffer circuitry of claim 16, wherein the third inductor is electrically connected between the second input node and the fourth node, and the fourth inductor is electrically connected between the fourth node and the second resistor.

19. The differential buffer circuitry of claim 18, wherein the second capacitor is connected in parallel with the second resistor and the fourth inductor.

20. The differential buffer circuitry of claim 13, wherein the first coil circuitry is configured to isolate the first capacitor from the first input node, and the second coil circuitry is configured to isolate the second capacitor from the second input node.

* * * * *